(12) United States Patent
Schuette (10) Patent No.: US 8,964,491 B2
(45) Date of Patent: Feb. 24, 2015

(54) GRAPHENE-BASED MEMORY DEVICES AND METHODS THEREFOR

(71) Applicant: OCZ Technology Group Inc., San Jose, CA (US)

(72) Inventor: Franz Michael Schuette, Colorado Springs, CO (US)

(73) Assignee: OCZ Storage Solutions Inc., San Jose, CA (US)

( * ) Notice: Subject to any disclaimer, the term of this patent is extended or adjusted under 35 U.S.C. 154(b) by 0 days.

(21) Appl. No.: 13/775,916

(22) Filed: Feb. 25, 2013

(65) Prior Publication Data

US 2013/0223166 A1 Aug. 29, 2013

Related U.S. Application Data

(60) Provisional application No. 61/602,181, filed on Feb. 23, 2012.

(51) Int. Cl.
| | |
|---|---|
| *G11C 7/00* | (2006.01) |
| *H01L 21/02* | (2006.01) |
| *B82Y 10/00* | (2011.01) |
| *G11C 13/02* | (2006.01) |
| *H01L 29/68* | (2006.01) |
| *H01L 29/16* | (2006.01) |
| *B82Y 99/00* | (2011.01) |

(52) U.S. Cl.
CPC ............ *G11C 7/00* (2013.01); *H01L 21/02107* (2013.01); *B82Y 10/00* (2013.01); *G11C 13/025* (2013.01); *H01L 29/685* (2013.01); *H01L 29/1606* (2013.01); *B82Y 99/00* (2013.01); *G11C 2213/35* (2013.01)
USPC ..................... 365/189.16; 365/205

(58) Field of Classification Search
CPC ......................................................... G11C 7/00
USPC ..................... 365/145, 189.16, 205
See application file for complete search history.

(56) References Cited

U.S. PATENT DOCUMENTS

| | | | |
|---|---|---|---|
| 2002/0054522 A1* | 5/2002 | Inoue et al. | 365/200 |
| 2011/0170330 A1* | 7/2011 | Oezyilmaz et al. | 365/145 |

OTHER PUBLICATIONS

Avetisyan et al., "Electric field tuning of the band gap in grapheme multilayers", Physical Review B, vol. 79, 035421 (2009).*
Aoki et al., "Dependence of band structures on stacking and field in layered grapheme", Solid State Communications, vol. 142, pp. 123-127 (2007).*
Mak et al., "Electronic structure of few layer Graphene: experimental demonstration of strong dependence on stacking sequence", Physical Review Letters vol. 104, 176404 (2010).*
Bao et al., "Stacking-dependent band gap and quantum transport in trilayer graphene", Nature Physical, vol. 7, pp. 948-952 (2011).*
Jannik C. Meyer, C.O. Girit, M.F. Crommie, and A. Zettl; "Hydrocarbon lithography on graphene membranes", Applied Physics Letter 92, American Institute of Physics 2008, p. 123110-1/3

* cited by examiner

*Primary Examiner* — Michael Tran
(74) *Attorney, Agent, or Firm* — Hartman Global IP Law; Gary M. Hartman; Michael D. Winter (57) ABSTRACT

Memory technology adapted to store data in a binary format. Such technology includes a semiconductor memory device having memory cells, each having a substrate and at least three graphene layers that are oriented to define a graphene stack disposed in a plane. The graphene stack of each memory cell is connected to a bit line and to a ground connection so that a conductive path is defined in the plane of the graphene stack. The in-plane conductivity of the graphene stack of each memory cell is altered during programming of the memory cell to define a binary value of bits stored in the memory cell.

20 Claims, 5 Drawing Sheets

GRAPHENE-BASED MEMORY DEVICES AND METHODS THEREFOR

CROSS REFERENCE TO RELATED APPLICATIONS

This application claims the benefit of U.S. Provisional Application No. 61/602,181, filed Feb. 23, 2012, the contents of which are incorporated herein by reference.

BACKGROUND OF THE INVENTION

The present invention generally relates to non-volatile data storage devices for use with computers and other processing apparatuses. More particularly, this invention relates to stacked graphene layers employed as solid state storage media, and using a tunable band gap associated with the graphene layers to indicate a bit value stored in the storage media.

Mass storage devices such as advanced technology attachment (ATA) drives and small computer system interface (SCSI) drives are rapidly adopting non-volatile memory technology, such as flash memory or another emerging solid-state memory technology including phase change memory (PCM), resistive random access memory (RRAM), magnetoresistive random access memory (MRAM), ferromagnetic random access memory (FRAM) or organic memories. Currently the most common solid-state technology uses NAND flash memory components as inexpensive storage memory, often in a form commonly referred to as a solid-state drive (SSD). These memory devices generally comprise an array or grid of cells, each capable of reversibly storing data indicated by a form of charge state within the cell that can be changed by a switching event induced by the application of power (e.g., current, heat, etc.) to the cell. All mentioned technologies, however, are limited by their scalability towards smaller process technologies. The primary limitations are related to the interconnect layers with respect to delivering enough power to induce changes in the targeted cells as, for example, needed in MRAM or PCM, or to the limited scalability of the actual memory cells.

In view of the problems outlined above, it appears desirable to find new materials and structures suitable for manufacturing memory cells capable of reversibly storing data, being scalable towards small process technologies, and having low power requirements for sensing data and/or inducing a switching event from one state to another.

BRIEF DESCRIPTION OF THE INVENTION

The present invention provides memory technology adapted to store data in a binary format, including semiconductor memory devices and methods for their operation and manufacture.

According to a first aspect of the invention, a semiconductor memory device comprises a plurality of memory cells, each having a substrate and at least three graphene layers that are oriented to define a graphene stack disposed in a plane. The graphene stack of each memory cell is connected to a bit line and to a ground connection so that a conductive path is defined in the plane of the graphene stack. Means is provided for altering the in-plane conductivity of the graphene stack of each memory cell during programming of the memory cell to define a binary value of bits stored in the memory cell.

According to a second aspect of the invention, a method is provided for storing binary data in a semiconductor memory device having a plurality of memory cells. Each memory cell comprises a substrate and at least three graphene layers on the substrate that are oriented to define a graphene stack disposed in a plane. The graphene stack of each memory cell is connected to a bit line and to a ground connection so that a conductive path is defined in the plane of the graphene stack. The method comprises operating voltage sources to selectively deliver a read voltage or a programming voltage to the graphene stack of each memory cell to alter an in-plane conductivity of the graphene stack, wherein the programming voltage is higher than the read voltage.

According to a third aspect of the invention, a method is provided for manufacturing a semiconductor memory device. The method includes providing at least three graphene layers on a substrate so that the graphene layers are oriented to define a graphene stack disposed in a plane, and connecting a bit line and a ground connection to the graphene stack so that a conductive path is defined in the plane of the graphene stack.

A technical feature of the invention is the ability to manufacture semiconductor memory devices comprising memory cells that are capable of reversibly storing data and being scalable towards small and preferably ultra-small process technologies, while preferably also having the potential for relatively low power requirements for sensing data and/or inducing a switching event between conducting and insulating states that define binary values of bits stored in the memory cells.

Other aspects and advantages of the invention will be better appreciated from the following detailed description.

DETAILED DESCRIPTION OF THE INVENTION

As well known in the art, conductive or insulating properties of solid materials depend on whether electrons can move from one atom or molecule to another. Movement of electrons (electrical current flow) depends on the amount of energy necessary to move electrons across different energy levels from the so-called valence band to the so called conduction band. The two bands of energy are separated by the band gap which is considered an electron-free zone in which no electrons can be present.

Historically, electrons have been considered to be fundamental parts of individual atoms, establishing the chemical bonds between atoms and thereby providing the glue to hold molecules together. According to the molecular orbital theory, electrons are shared across the entire molecule where they move under the influence of the nuclei within the whole molecule. The number of molecular orbitals is the same as the combined number of all atomic orbitals delocalized over the entire molecule. The molecular orbitals are close enough to each other to constitute a so-called "band" in which electrons can move freely, thereby conducting electricity. Electron movement can only occur if a band is neither completely empty nor completely filled with electrons, and orbitals filled with electrons need to alternate with unoccupied orbitals constituting so-called electron holes.

Two bands are interacting with each other whenever electrons are flowing, meaning that electric current occurs. One of the bands contains valence electrons and is therefore referred to as the valence band. The other band contains unoccupied orbitals and is known as the conduction band. Electrical conduction is the promotion of electrons from the valence band to the conduction band, where they can move throughout the solid. The energy separation between the valence and conduction bands is known as the band gap energy.

Solids are composed of multiple molecules that can either be the same or different. Electrical insulators, electrical conductors, and semiconductors constitute three general categories of solids, and these categories can be defined by the size of the band gap or separation between the valence and conduction bands. In conductors (for example, metals and their alloys), this band gap approaches zero since the conduction and valence bands overlap, thereby allowing unimpeded movement of electrons within the solid.

Figure 1:
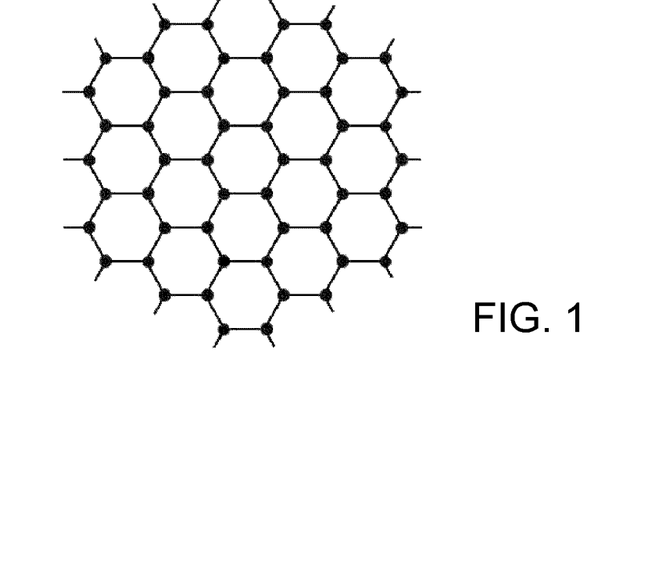
FIG. 1 schematically represents a honeycomb crystal lattice arrangement of carbon atoms typical in a sheet of graphene.

Graphene is the basic structural element of several carbon allotropes, including graphite, charcoal, fullerenes (spherical or ellipsoid Buckminster fullerenes), and carbon nanotubes (rolled sheets of graphene). Briefly, graphene is an allotrope of carbon, whose structure is made of a one-atom-thick planar sheet (monolayer) of $sp^2$-bonded carbon atoms that are densely packed in a crystal lattice resembling a honeycomb arrangement. Graphenes were first described as single-layer carbon foils and are most easily visualized as an atomic-scale honeycomb made of carbon atoms and their bonds, as represented in FIG. 1. The crystalline or "flake" form of graphite is formed by a stack of many graphene sheets. The carbon-carbon bond length in graphene is about 0.142 nm. In graphite, the distance between an immediately adjacent decoupled pair of graphene monolayers (interplanar spacing) is about 0.335 nm, such that the interplanar spacing is more than twice the distance of the intra-layer carbon-carbon bond. The decoupled monolayers are held together by relatively weak Van der Waals (VDW) forces.

For a better understanding of the electrical properties of graphene monolayers, one may view each monolayer as a flat polycyclic aromatic hydrocarbon, in other words, a single, indefinitely large aromatic molecule. Each monolayer is de facto a single set of molecular orbitals. Therefore, electrons, which can freely flow throughout the molecular orbitals of the entire molecule, can propagate unimpeded throughout the entire monolayer. Accordingly, a graphene layer having a single molecular structure behaves electrically similar to metals, and graphene can be considered to be a semi-metal.

The isolation of monolayers and oligo-layers (stacks containing small number of layers) of graphene has been achieved by micromechanical cleavage of flakes from natural graphite, for example, using adhesive tape. For use in manufacturing processes, for example, the manufacture of electronic devices, such types of cleavage-based harvesting of sheet of graphene would typically be inadequate. However, a number of alternative technologies have been developed that are capable of producing monolayer and oligo-layer graphene sheets. At present, techniques available to create oligo-layer sheets include, for example, epitaxial growth on silicon carbide (SiC) and metal (e.g., copper) substrates, graphite oxide reduction, growth from metal-carbon melts, pyrolysis of sodium ethoxide, cutting open of nanotubes, sonication of graphite, and dry ice methods. Single-layer deposition techniques include the use chemical vapor deposition (CVD) and vapor phase epitaxy (VPE), in which epitaxial growth of graphene is accomplished, for example, by heating SiC to about 1100° C. Particularly promising is the technique of epitaxial growth of graphene on the C-face of a SiC substrate, since this technique yields isolated self-organized and strain-relaxed graphene ribbons having lengths and widths of, for example, up to about 100 µm×5 µm, which can be sufficient for implementation in electronic devices.

Controlling the number of deposited layers can be somewhat problematic. In fact, counting the number of layers in a given stack can be time-consuming and expensive. Recent advances using angle resolved ultraviolet photoelectron spectroscopy (ARUPS) and low energy electron diffraction (LEED) are capable of resolving this issue by allowing precise counting of the number of graphene layers, thereby moving controlled oligo-layer production of graphene closer to feasible production.

Another technology for creating a controlled number of layers involves folding of single graphene sheets, which results in decoupled layers that can be described as "floating" on top of each other. Folded layers typically exhibit a rotational difference of the honeycomb pattern between the layers, but otherwise show little difference in their physical properties compared to epitaxially-grown layers.

Yet another technology for creating a controlled number of layers involves the synthesis of carbon nano-ribbons, which as used herein are zigzagged ribbons of graphene monolayers. These ribbons can be manufactured to achieve high yields of defect-free ribbons that have a consistent rotational orientation of the honeycomb lattice, which greatly facilitates the generation of controlled stacks of decoupled layers with identical or near-identical two-dimensional properties. Moreover, nano-ribbons can be manufactured at a consistent size, thereby eliminating the need for lithography or other techniques to cut a graphene sheet to meet the dimensional requirements of an application.

Figure 2:
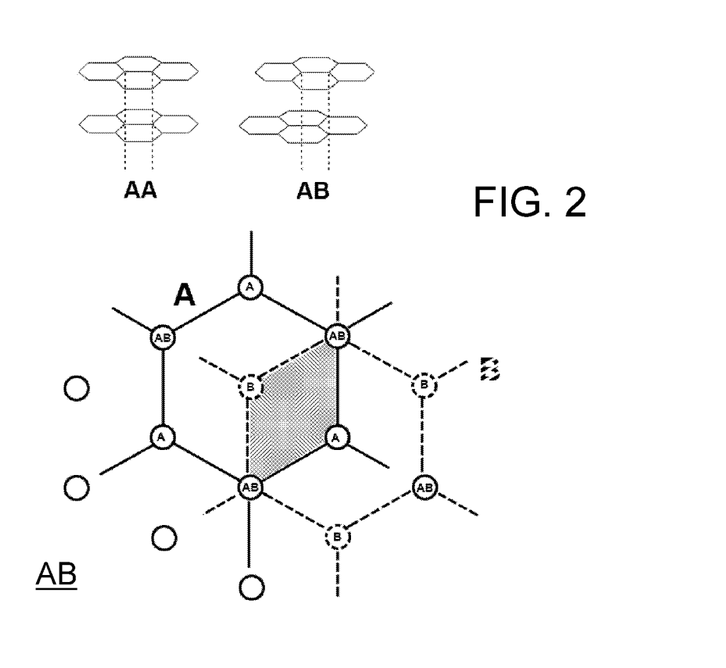
FIG. 2 schematically represents a side view showing the relative positions of the crystal lattices of two graphene monolayers arranged so that their lattice arrangements are superimposed on each other (AA), a side view showing the relative positions of the crystal lattices of two graphene monolayers arranged in what is referred to herein as a Bernal stack (AB), and a plan view showing the relative positions of the crystal lattices of two graphene monolayers arranged in a Bernal stack.
Figure 3:
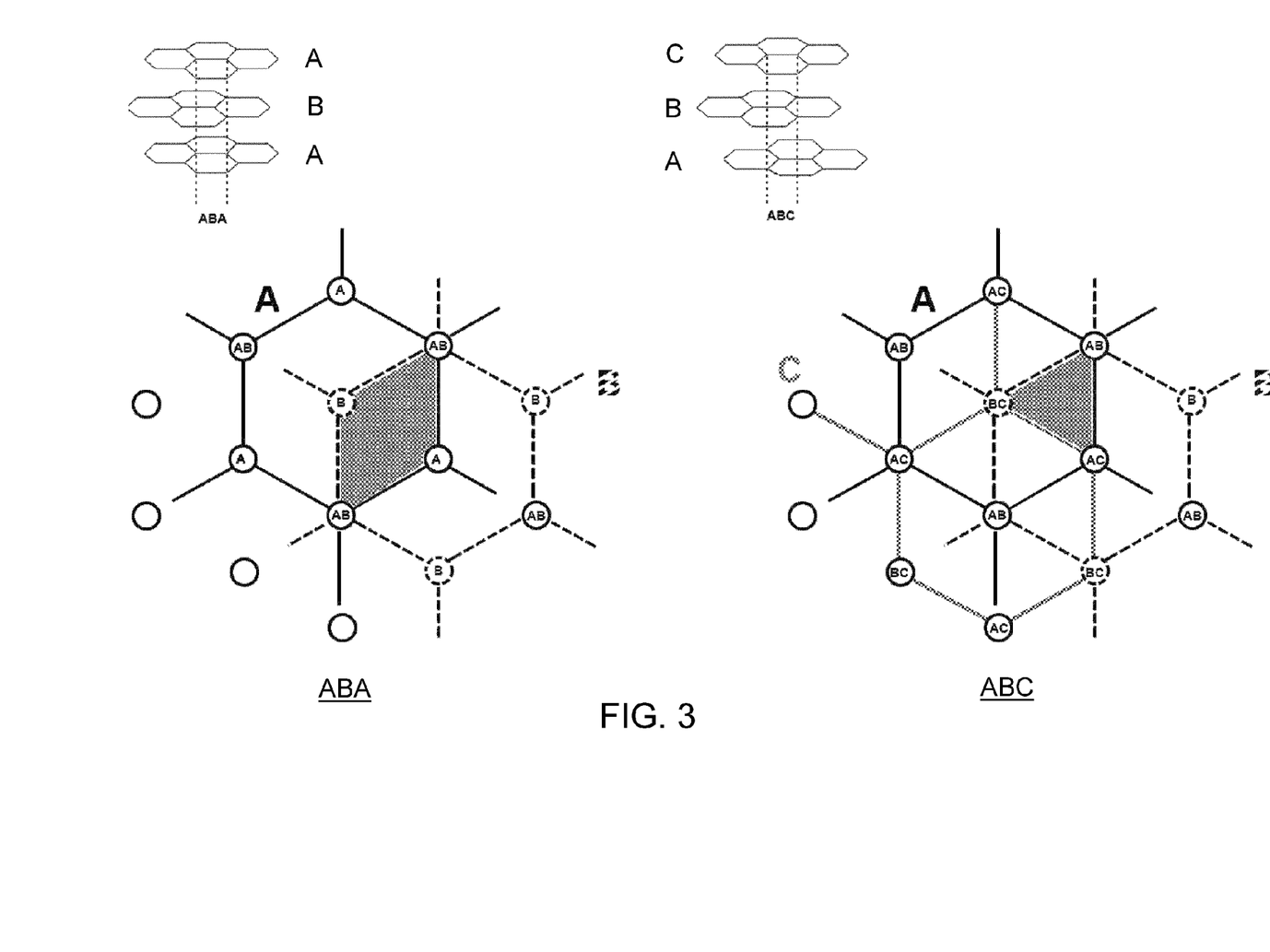
FIG. 3 schematically represents side and plan views showing the relative positions of the crystal lattices of three graphene monolayers arranged in a Bernal stack (ABA) configuration, and side and plan views showing the relative positions of the crystal lattices of three graphene monolayers arranged in what is referred to herein as a rhombohedral stack (ABC) configuration.

Stacked monolayers of graphene can have very different electrical and optical properties depending on the relative positions of the monolayers with respect to each other. If two monolayers layers are placed on top of each other, one atomic "corner" of each individual hexagonal structure within one monolayer will almost always fall into the center of an individual hexagonal structure within of an immediately adjacent monolayer, as represented by the "AB" configuration shown in side and plan views in FIG. 2. This type of arrangement has been referred to as a Bernal-stacked bi-layer configuration, and is characterized by high electrical conductivity (effectively, an electrical conductor). If, as represented in FIG. 3, a third monolayer were to be deposited or otherwise disposed on the bi-layer stack of FIG. 2, the atomic lattice of the third monolayer may line up with (superimpose) that of the first (lowermost in FIG. 3) monolayer to form a Bernal-stacked "ABA" tri-layer configuration. Alternatively, the atomic lattice of the third monolayer may be shifted by one atom's width into a third position that is different from the other two monolayers to form a rhombohedral-stacked "ABC" tri-layer configuration, in which case the atomic lattice of the third monolayer does not line up with (does not superimpose) those of the first and second monolayers (lowermost and middle layers in FIG. 3). In the plan views of FIG. 3, taken orthogonally to what will be referred to as the plane of a stack containing the monolayers, the overlap between three hexagonal structures from each of the three monolayers is represented by shading for each of the ABA and ABC tri-layer configurations.

In contrast to the high electrical conductivity of the Bernal-stacked ABA configuration, the rhombohedral-stacked ABC configuration is highly insulating (effectively, an electrical insulator). The theoretical basis of this phenomenon is still poorly understood other than that in three rhombohedral-stacked monolayers the first order Brillouin zones of all three layers create an uninterrupted 200% coverage of the three layers with overlapping Dirac points of two layers as the points of lowest electrical conductance at each of the $sp^2$ aromatic bonds and their Berry phases in opposite orientation. One possible explanation for the shift in electrical properties may relate to the fact that the phase-shifted electromagnetic fields at the Dirac points could block electron migration across the band gap. However, these theoretical aspects are relatively inconsequential for the functionality of the present invention. Suffice it to say that regardless of the specific aspects of quantum physics, the band gap increases substantially from a Bernal-stacked graphene ABA configuration to the rhombohedral-stacked ABC configuration.

Even if epitaxially grown, interlayer interaction between graphene monolayers is governed primarily by Van der Waals force, i.e., the attractive force between molecules without any actual bonds between juxtaposed layers. Therefore, it is possible to shift the x-y coordinates of such juxtaposed yet effectively decoupled monolayers, i.e., move a monolayer in a direction lying in the plane of a stack. Recent experimental findings showing unexpectedly pronounced effects of applied electrical fields or bias currents on intra-layer conductivity strongly support the idea that these changes in electrical conductivity or resistance may be attributable to the effect of interlayer asymmetries caused by the electrical field effects. The present invention utilizes this phenomenon to tune the band gap associated with a stack of graphene monolayers through the application of an asymmetrically applied voltage or a bias current on one side of the plane defined by the graphene stack, so that a resulting electrical field shifts the x-y coordinates between the monolayers to reversibly alter the conductivity and/or resistivity in the x-y plane of (as well as in the direction of the z-axis through) the monolayers.

Figure 4:
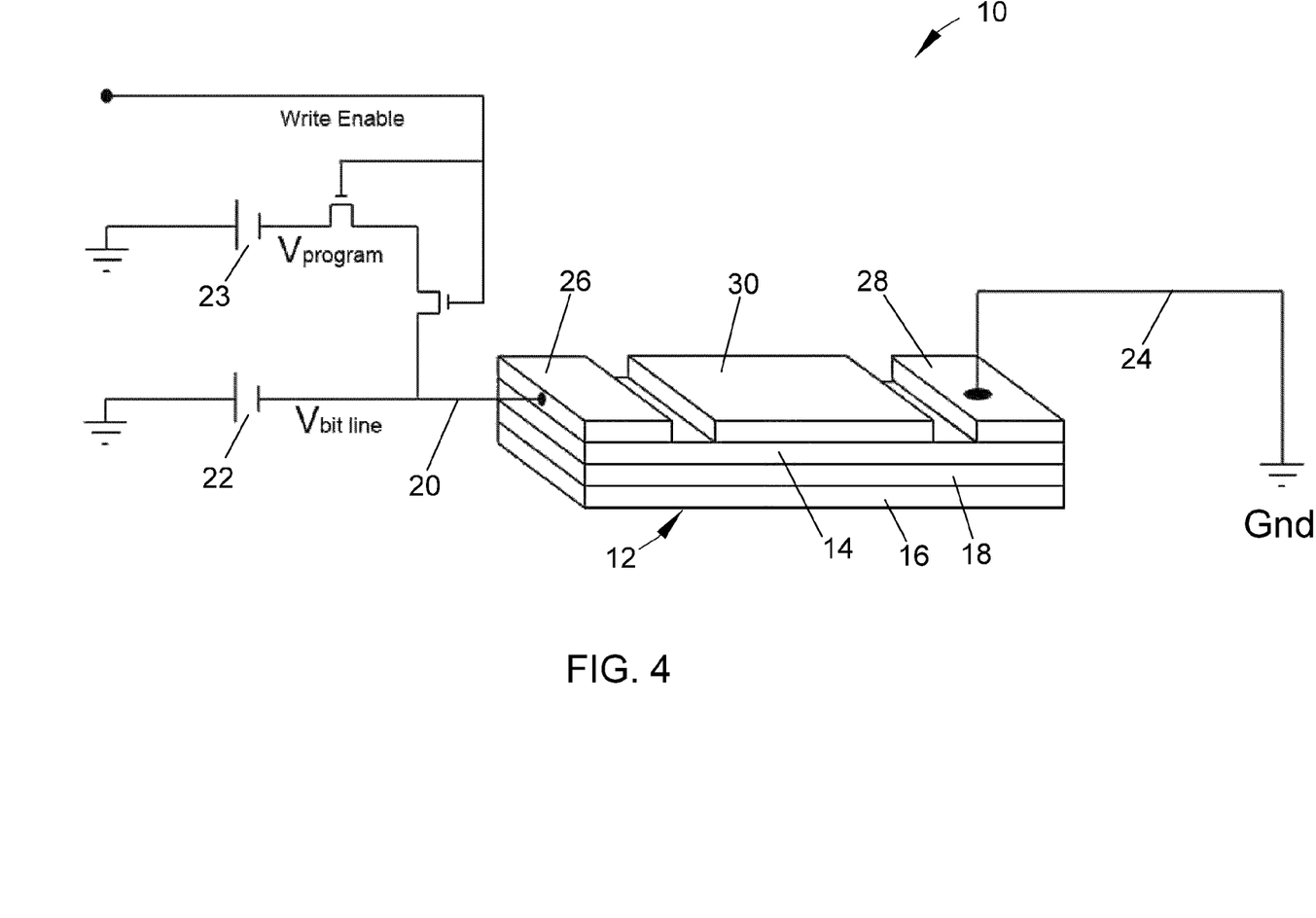
FIG. 4 schematically represents a perspective view of a memory cell of a semiconductor memory device, in which the memory cell comprises a graphene stack adapted to store data in a binary format.

FIG. 4 schematically represents an embodiment of the invention in which the above concepts can be implemented in a solid state memory device 10 to store data in a binary format. More particularly, FIG. 4 schematically represents a cell 12 of the solid state memory device 10, which in preferred embodiments would contain an array of such memory cells 12 organized into rows and columns with the intersections of rows and columns defining address locations of the memory cells 12, as is commonly the case in semiconductor memory devices that employ existing solid state technologies. Also consistent with existing solid state memory devices, in addition to the memory cells 12 the memory device 10 would typically contain input/output buffers, row and column decoders, and address strobes for both dimensions of the array. In addition, power supply and voltage generator structures as required and known in the art would be present on the memory device 10. FIG. 4 schematically represents a stack 14 of graphene monolayers on a substrate 16 and separated from the substrate 16 by an electrical insulating layer 18 (which may also be viewed as a substrate). The substrate 16 may be a conductor, insulator, or semiconductor material, for example, silicon, a metallic material, etc. If the substrate 16 is formed of silicon, a convenient material for the insulating layer 18 is silicon dioxide. The monolayers of the graphene stack 14 of each cell 12 can be formed by any suitable technique, particularly any of the aforementioned techniques. For example, each of the first monolayers of the cells 12 may be epitaxially grown on the insulating layer 18, and subsequent monolayers (for example, the second and third monolayers depicted in FIG. 3) may be deposited by VPE or other suitable techniques. Alternatively or in addition, one or more carbon nano-ribbons can be created and stacked on the substrate 16. Each stack 14 preferably but not necessarily contains three graphene monolayers, and may contain monolayers in multiples of three. The stack 14 may be annealed following the creation of the monolayers to relieve stresses.

Figure 5:
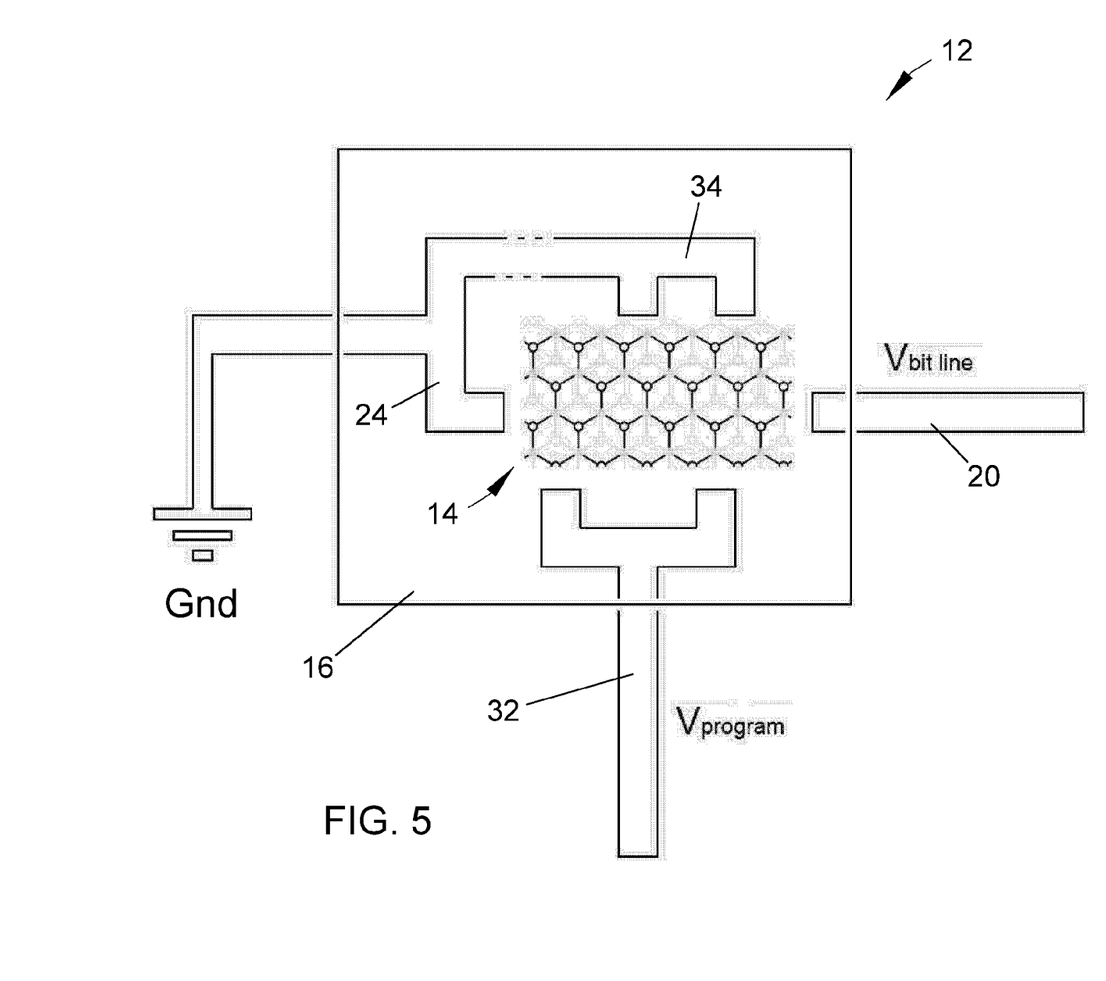
FIG. 5 schematically represents a plan view of a memory cell similar to FIG. 4, but modified to comprise separate read and programming voltage contacts arranged orthogonally to each other.

FIG. 4 further represents the cell 12 as being connected to a bit line 20 tied to multiple voltage sources 22 and 23 and a connection 24 to ground so that a conductive path is defined that lies in the plane of the stack 14, i.e., parallel to the individual monolayers. As a nonlimiting example, the bit line 20 and ground connection 24 are shown connected to the cell 12 by electrodes 26 and 28 overlying and contacting the stack 14 at or near oppositely-disposed edges or sides of the stack 14. The cell 12 is represented as further having a second insulating layer 30 (for example, silicon dioxide) disposed on top of the graphene stack 14. Optionally, FIG. 5 represents the inclusion of voltage and ground connections 32 and 34 in addition to the bit line 20 and ground connection 24. These additional voltage and ground connections 32 and 34 are shown as being aligned on the cell 12 to have a substantially orthogonal orientation to the edge-to-edge direction defined by the conductive path between the bit line 20 and ground connection 24.

As previously noted, the application of an electrical field to the stack 14 of graphene monolayers can be used to cause a shift among the individual monolayers of graphene within the stack 14 that results in the stack 14 switching between the highly-conductive state associated with the Bernal-stack ABA configuration and the highly-insulating state associated with the rhombohedral-stack ABC configuration (FIG. 3). As a particular but nonlimiting example, the individual monolayers of graphene within the stack 14 can be deposited to have the Bernal-stack ABA configuration characterized by high conductivity, so that the application of an electrical field to the stack 14, for example, by applying a bias current to the stack 14 through the bit line 20, causes an x-y coordinate shift that results in the highly-insulating rhombohedral-stack ABC configuration within the graphene stack 14.

Based on the above nonlimiting example, the memory cells 12 of the device 10 represented in FIGS. 4 and 5 can be operated in the following manner. In the case of a read access to the memory device 10, the bit line 20 is connected to a read voltage source 22 and the resulting electrical current passing in-plane through the graphene stack 14 of the cell 12 can be sensed through any suitable current sensing device and/or technique, and the current flow through or the electrical resistance of the stack 14 can be interpreted as binary bits. Reads can occur with the stack 14 in the conductive ABA configuration. Cells 12 of the device 10 are programmed by using the write enable signal (FIG. 4) to operate a select gate that disconnects the read voltage source 22 from the bit line 20 and connects the bit line 20 to a programming voltage source 23 for the purpose of changing the binary values of bits stored in the memory cells 12 by reversibly altering the state of individual cells 12. For example, the programming voltage source 23 can be adapted to generate a programming pulse or a high frequency alternating current to the bit line 20 until the resistance across the cell 12 reaches a desired state of electrical conductance or insulation attributable to the stack 14 of a cell 12 shifting to the ABC configuration. Alternatively, the orthogonally-arranged additional connections 32 and 34 of FIG. 5 can be used to apply programming pulses, wherein the programming pulses alternate with sensing of the conductivity/resistance at the bit line 20 after applying a read voltage until a desired state is achieved. Another approach is to directly sense the resistance across the cell 12 using the programming pulses applied to the additional connections 32 and 34. Once a steady state of the cell 12 has been achieved, no additional bias is necessary to maintain the state. To avoid read-disturb problems, the read voltage is substantially lower than the programming voltage, in other words, the programming voltage is intentionally higher than the read voltage.

Figure 6:
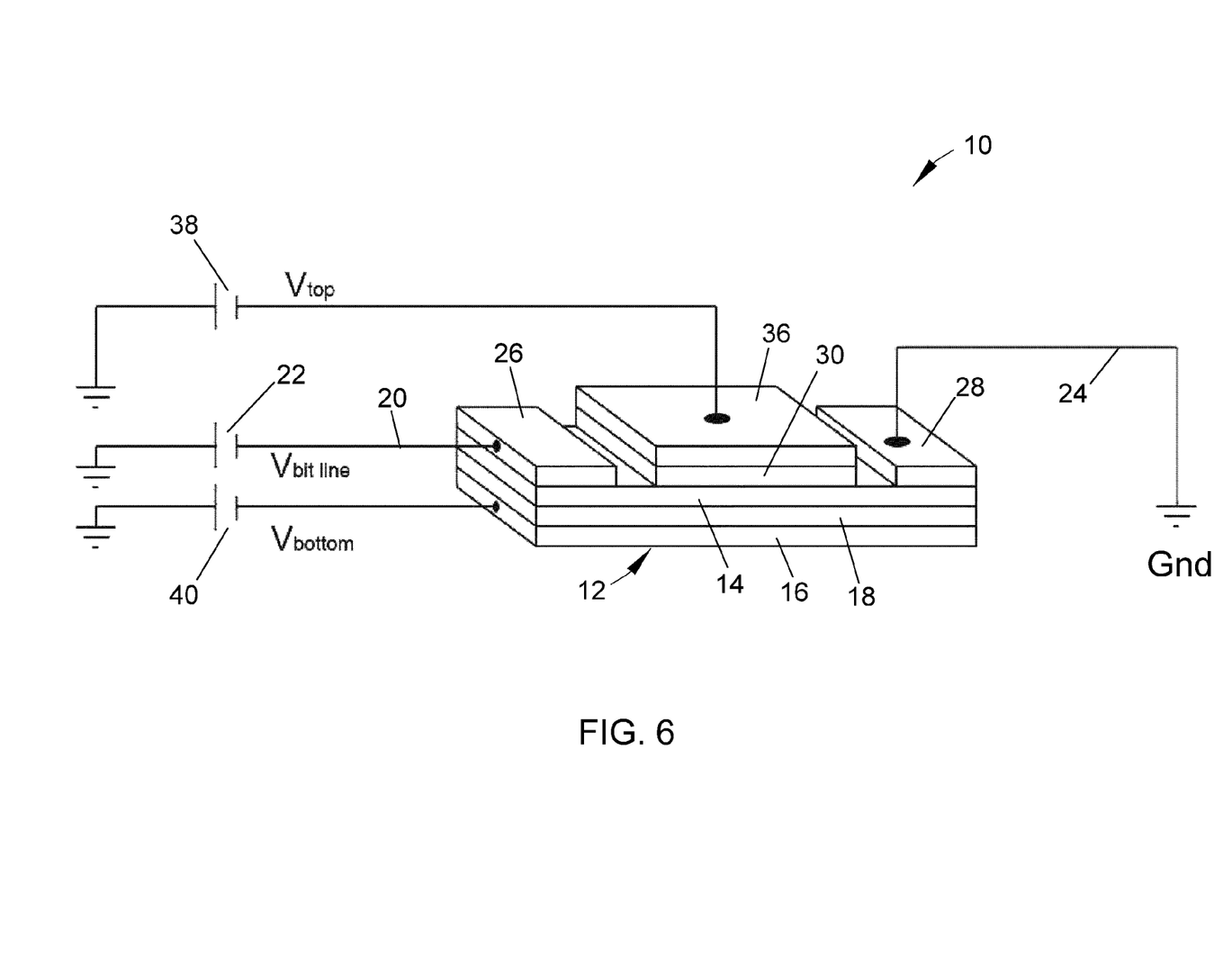
FIG. 6 schematically represents a perspective view of a memory cell similar to FIG. 4, but modified to comprise additional top and bottom electrodes.

In another embodiment represented in FIG. 6, the memory cell 12 of FIG. 4 can be modified to have an additional top gate 36 separated from the graphene stack 14 by the insulating layer 30. The top gate 36 can be connected to another voltage source 38 to apply an electrical field in an orthogonal direction to the plane of the stack 14 for augmentation or counteracting the programming voltage. In addition or alternatively, if the substrate 16 is formed of a conductive material, a voltage source 40 can be connected to the substrate 16 to apply an electrical field for augmentation or counteracting the programming voltage.

While the invention has been described in terms of specific embodiments, it is apparent that other forms could be adopted by one skilled in the art. For example, doping of graphene sheets could be used to modulate their electrical properties and inter-layer interactions. Therefore, the scope of the invention is to be limited only by the following claims.

The invention claimed is:

1. A semiconductor memory device adapted to store data in a binary format, the memory device comprising: a plurality of memory cells, each memory cell having a substrate and at least three graphene layers that are oriented to define a graphene stack disposed in a plane, the graphene stack of each memory cell being connected to a bit line and to a ground connection so that a conductive path is defined in the plane of the graphene stack; and means for altering in-plane conductivity of the graphene stack of each of the memory cells during programming of the memory cells to define a binary value of bits stored in the memory cells, wherein changes in the in-plane conductivity are characterized by shifts from a first configuration to a second configuration among the graphene layers within the graphene stacks of the memory cells, the first and second configurations being maintained without a bias.

2. The semiconductor memory device of claim 1, wherein the altering means is adapted to apply a programming voltage to the memory cells by connecting a programming voltage source to the bit line.

3. The semiconductor memory device of claim 2, further comprising electrodes adapted to apply electrical fields in orthogonal directions to the planes of the graphene stacks of the memory cells for the purpose of augmenting or counteracting the programming voltage.

4. The semiconductor memory device of claim 1, wherein the altering means is adapted to apply a programming voltage to the memory cells through a voltage connection and a second ground connection that are aligned to have a substantially orthogonal orientation to the conductive path defined by and between the bit line and the ground connection in the plane of the graphene stack.

5. The semiconductor memory device of claim 4, further comprising electrodes adapted to apply electrical fields in orthogonal directions to the planes of the graphene stacks of the memory cells for the purpose of augmenting or counteracting the programming voltage.

6. The semiconductor memory device of claim 1, wherein changes in the in-plane conductivity are characterized by shifts from a Bernal-stacked ABA configuration to a rhombohedral-stacked ABC configuration among the graphene layers within the graphene stacks of the memory cells.

7. The semiconductor memory device of claim 1, wherein changes in the in-plane conductivity are characterized by shifts from a rhombohedral-stacked ABC configuration to a Bernal-stacked ABA configuration among the graphene layers within the graphene stacks of the memory cells.

8. The semiconductor memory device of claim 1, wherein each of the graphene stacks consists of three of the graphene layers.

9. A method of storing binary data in a semiconductor memory device having a plurality of memory cells, wherein each of the memory cells comprises a substrate and at least three graphene layers on the substrate that are oriented to define a graphene stack disposed in a plane, the graphene stack of each memory cell being connected to a bit line and to a ground connection so that a conductive path is defined in the plane of the graphene stack, the method comprising operating voltage sources to selectively deliver a read voltage or a programming voltage to the graphene stack of each of the memory cells to alter an in-plane conductivity of the graphene stack of at least one of the memory cells, wherein the programming voltage is higher than the read voltage, wherein changes in the in-plane conductivity are characterized by shifts from a first configuration to a second configuration among the graphene layers within the graphene stacks of the memory cells, the first and second configurations being maintained without a bias.

10. The method of claim 9, further comprising sensing data stored in the memory cells as a level of conductance through the graphene stacks thereof in the plane defined thereby.

11. The method of claim 9, wherein the memory cells are arranged in rows and columns and the method further comprises addressing the rows and columns through a row-select and a column-select strobe.

12. The method of claim 9, further comprising generating an electrical field within at least one of the memory cells through an electrode separated from the graphene stack thereof by an insulating layer.

13. The method of claim 9, wherein the in-plane conductivity of the graphene stack is altered by applying the programming voltage to the bit line.

14. The method of claim 9, wherein the in-plane conductivity of the graphene stack is altered by applying the programming voltage between a voltage connection and a second ground connection that are aligned to have a substantially orthogonal orientation to the conductive path defined by and between the bit line and the ground connection in the plane of the graphene stack.

15. A method for manufacturing the semiconductor memory device of claim 1, the method comprising:

providing the at least three grapheme layers on the substrate so that the graphene layers are oriented to define the graphene stack disposed in the plane; and connecting the bit line and the ground connection to the graphene stack so that the conductive path is defined in the plane of the graphene stack.

16. The method of claim 15, further comprising connecting the bit line via a select gate to a programming voltage source.

17. The method of claim 15, further comprising: connecting the graphene stack to a voltage connection and a second ground connection that are aligned to have a substantially orthogonal orientation to the conductive path defined by and between the bit line and the ground connection in the plane of the graphene stack; and connecting the voltage connection to a programming voltage source.

18. The method of claim 15, further comprising:
depositing an insulating layer on the graphene stack; disposing an electrode on the insulating layer; and
generating with the electrode an electrical field orthogonal to the plane defined by the graphene stack.

19. The method of claim 15, wherein the at least three graphene layers are provided on the substrate by epitaxial growth and/or deposition.

20. The method of claim 15, wherein the at least three graphene layers are provided on the substrate by creating and stacking carbon nano-ribbons on the substrate.

* * * * *